United States Patent
Langhammer

(10) Patent No.: US 9,344,113 B1
(45) Date of Patent: *May 17, 2016

(54) LEMPEL ZIV COMPRESSION ARCHITECTURE

(71) Applicant: Altera Corporation, San Jose, CA (US)

(72) Inventor: Martin Langhammer, Salisbury Wiltshire (GB)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/105,779

(22) Filed: Dec. 13, 2013

Related U.S. Application Data

(60) Division of application No. 13/099,028, filed on May 2, 2011, now Pat. No. 8,615,617, which is a division of application No. 11/560,232, filed on Nov. 15, 2006, now Pat. No. 7,937,510, which is a continuation-in-part of application No. 11/501,678, filed on Aug. 8, 2006, now abandoned, which is a continuation of application No. 11/049,072, filed on Feb. 1, 2005, now Pat. No. 7,109,895.

(51) Int. Cl.
*G06F 13/12* (2006.01)
*H03M 7/30* (2006.01)
*G06F 13/38* (2006.01)
*G06F 3/038* (2013.01)
*G06F 1/16* (2006.01)

(52) U.S. Cl.
CPC ............ *H03M 7/3088* (2013.01); *G06F 1/1632* (2013.01); *G06F 3/038* (2013.01); *G06F 13/385* (2013.01)

(58) Field of Classification Search
None
See application file for complete search history.

(56) References Cited

U.S. PATENT DOCUMENTS

| | | | |
|---|---|---|---|
| 4,597,074 A * | 6/1986 | Demichelis et al. | 370/463 |
| 5,003,307 A | 3/1991 | Whiting et al. | |
| 5,150,430 A | 9/1992 | Chu | |
| 5,255,226 A * | 10/1993 | Ohno et al. | 365/189.12 |
| 5,525,982 A | 6/1996 | Cheng et al. | |
| 5,874,907 A | 2/1999 | Craft | |

(Continued)

OTHER PUBLICATIONS

Jung et al., "Efficient VLSI for Lempel-Ziv Compression in Wireless Data Communication Networks," vol. 6(3), pp. 475-483, vol. 6(3), Sep. 1998.

Kim et al., "Realizations of Parallel and Multibit-Parallel Shift Register Generators", IEEE Transactions on Communications, vol. 45(9), pp. 1053-1060, Sep. 1997.

(Continued)

*Primary Examiner* — Henry Tsai
*Assistant Examiner* — Aurangzeb Hassan
(74) *Attorney, Agent, or Firm* — Fletcher Yoder, P.C.

(57) ABSTRACT

A data compression architecture comprises a shift register structure comprising first and second parallel paths, each comprising several shift register elements for storing previously received data characters. Each shift register element in the first path is paired with a respective shift register element in the second path. An input shift register stores input data characters in pairs during successive clock cycles. Logic circuitry compares the input data characters with each of the previously received data characters stored in the pairs of shift register elements to detect a match during one or more clock cycles. The logic circuitry determines a length of a sequence of received input data characters by determining a number of clock cycles during which a match is detected in a particular pair of shift register elements, and applies a correction factor based on a type of match detected at a beginning and end of the sequence.

17 Claims, 10 Drawing Sheets

(56) References Cited

U.S. PATENT DOCUMENTS

| | | | |
|---|---|---|---|
| 5,930,790 | A | 7/1999 | Law et al. |
| 5,982,307 | A * | 11/1999 | Adachi ............................ 341/84 |
| 5,999,562 | A * | 12/1999 | Hennedy et al. .............. 375/152 |
| 6,127,950 | A | 10/2000 | Yamauchi |
| 6,392,571 | B1 | 5/2002 | Chen et al. |
| 7,071,854 | B1 | 7/2006 | Cardosa et al. |
| 2005/0050419 | A1 | 3/2005 | Kapur et al. |

OTHER PUBLICATIONS

Ohta, A. et al., "New FPGA Architecture for Bit-Serial Pipeline Datapath," FPGAs for Custom Computing Machines, Proceedings, IEEE Symposium on pp. 58-68, Apr. 17, 1998.

Ziv et al., "A Universal Algorithm for Sequential Data Compression," IEEE Transactions on Information Theory, vol. IT-23(3), pp. 337-343, May 1997.

* cited by examiner

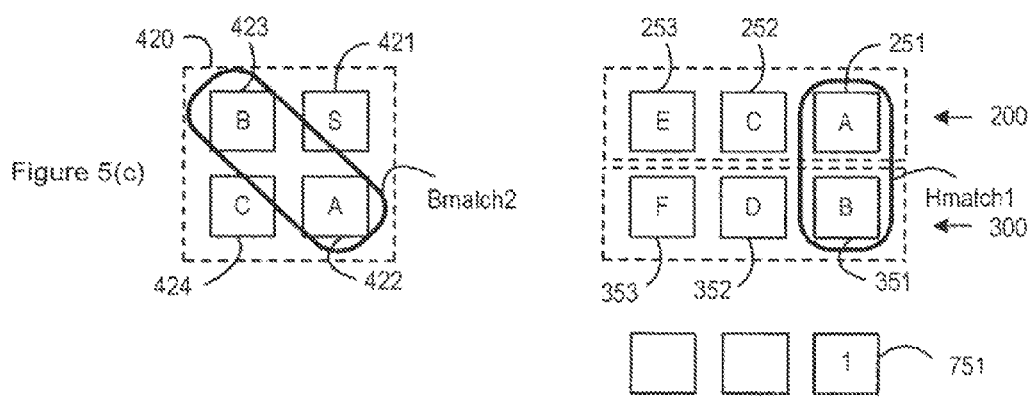
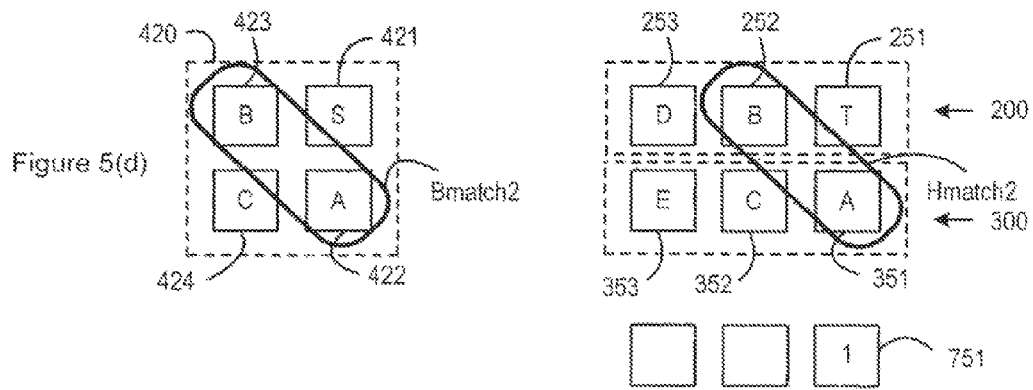

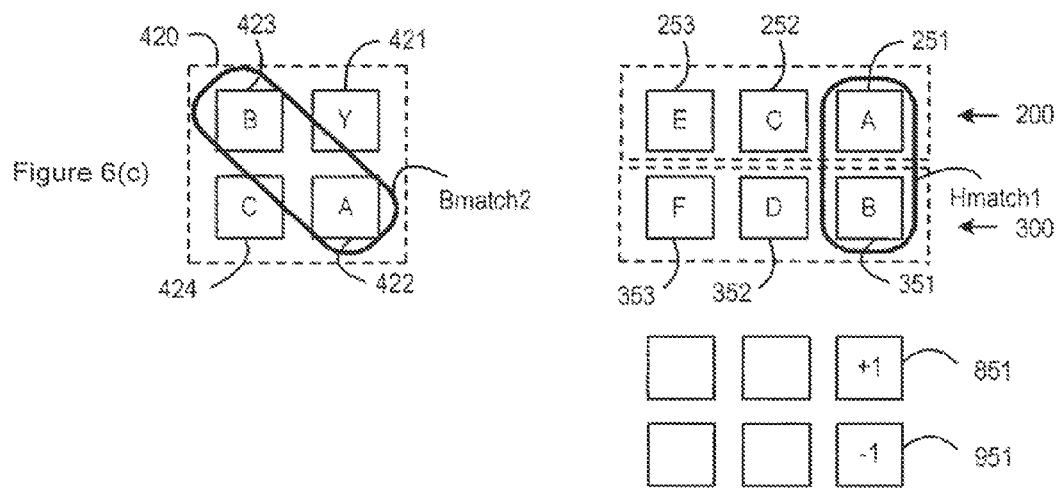
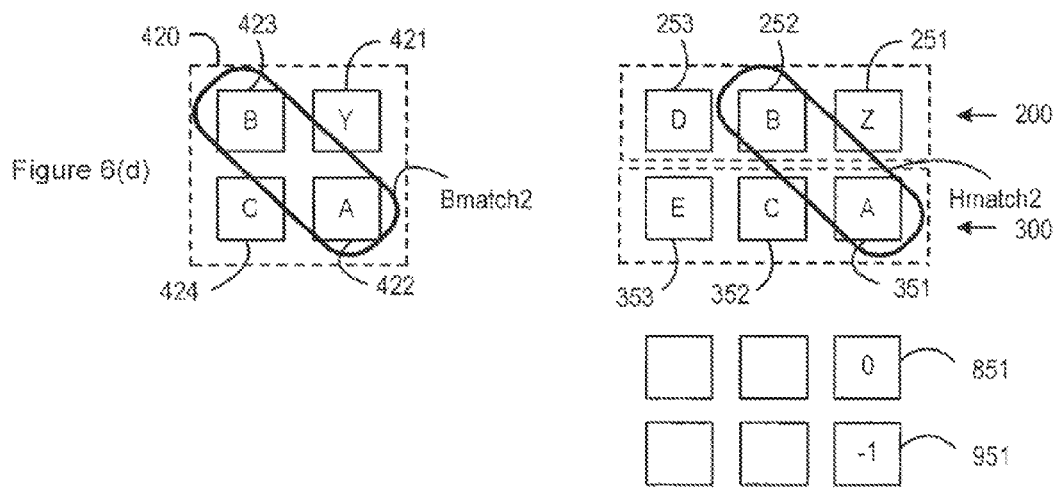

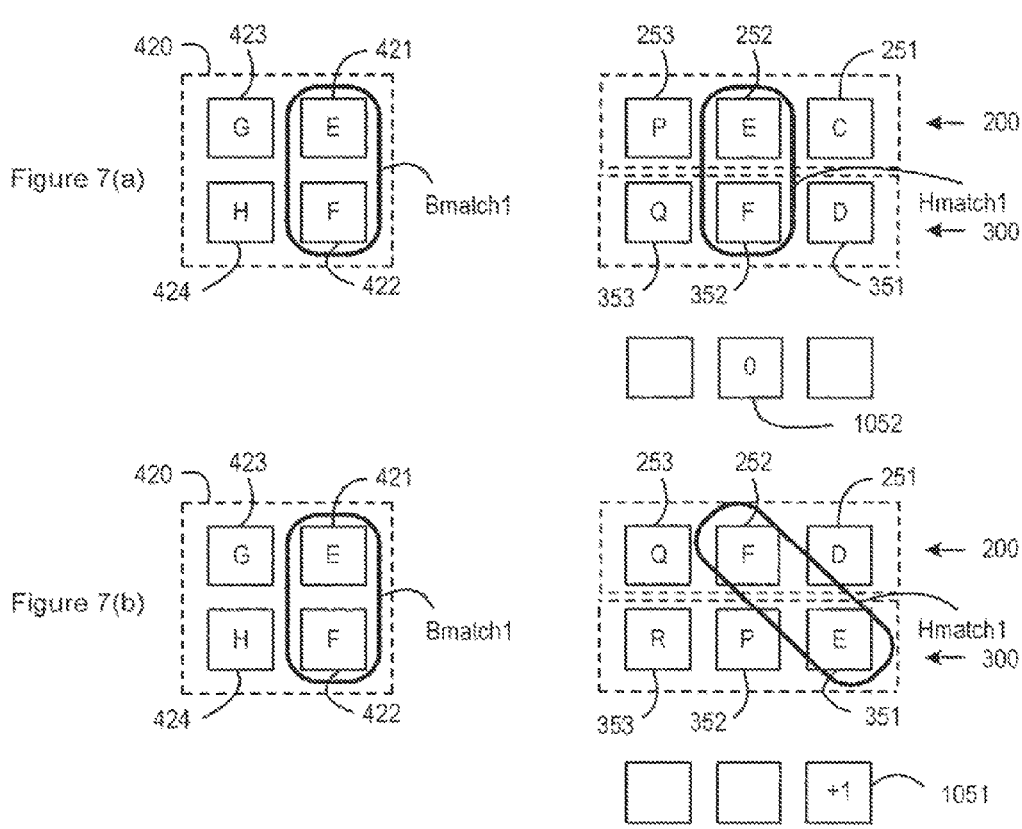

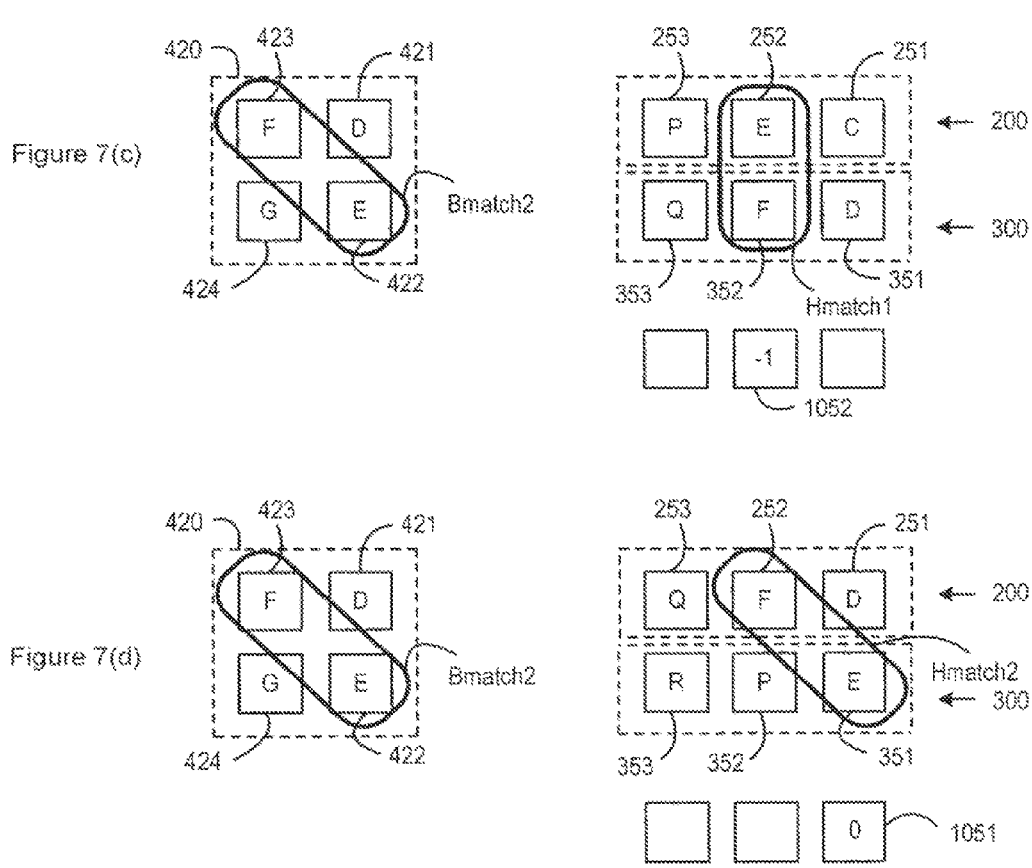

LEMPEL ZIV COMPRESSION ARCHITECTURE

CROSS-REFERENCES TO RELATED APPLICATIONS

The present application is a Divisional application of, and claims priority to, U.S. Non-Provisional application Ser. No. 13/099,028, filed May 2, 2011, now U.S. Pat. No. 8,615,617, which is itself a Divisional application of, and claims priority to, U.S. Non-Provisional application Ser. No. 11/560,232, filed Nov. 15, 2006, now U.S. Pat. No. 7,937,510, which is itself a Continuation-in-Part application of, and claims priority to, U.S. Non-Provisional application Ser. No. 11/501,678, filed on Aug. 8, 2006, now abandoned, which is itself a Continuation application of, and claims priority to, U.S. Non-Provisional application Ser. No. 11/049,072, filed on Feb. 1, 2005, now U.S. Pat. No. 7,109,895, the entire contents of each being hereby incorporated herein by reference for all purposes.

BACKGROUND OF THE INVENTION

This invention relates to data compression, and in particular to a hardware architecture that can be used to achieve data compression in accordance with the Lempel-Ziv compression algorithm.

When transmitting data over a communications channel, or when storing data, it is often useful to be able to compress the data, in order to reduce the resources required to transmit or store the data. Data compression techniques rely on the fact that most useful data contains patterns, which can be exploited in order to reduce the amount of data required in order to represent the source data. For example, when the source data contains one or more repeated sequences of characters, each of these can be represented more efficiently by a particular code. Provided of course that the code contains fewer bits of data than the sequence of characters, this representation reduces the amount of data required to represent the source data.

One well known data compression algorithm is the Lempel-Ziv data compression algorithm, originally described in the paper "A Universal Algorithm for Sequential Data Compression", Jacob Ziv and Abraham Lempel, IEEE Transactions on Information Theory, vol. IT-23, no. 3, May 1977, pages 337-343. In use of the Lempel-Ziv algorithm, a code dictionary is built up, based on the received data string. The received data can for example represent text made up of characters. Then, the available codes can be assigned to respective character strings, as they appear in the received text.

In practice, this is achieved by comparing received character strings with previously received character strings. More specifically, it is necessary to find the longest of the previously received character strings that can be matched with a newly received character string. The next character of the newly received character string is then combined with that longest of the previously received character strings to form a character string that can be represented by a new code.

It is known to provide a hardware apparatus for comparing received data with previously received character strings.

For example, U.S. Pat. No. 5,003,307 to Whiting et al discloses an apparatus comprising a shift register. A newly received character is input to a first stage of the shift register. At the same time, the newly received character is compared with the characters stored in the other stages of the shift register. Logic circuitry is used to identify stages in the shift register at which the newly received character matches the stored characters. This process continues until the string of newly received characters no longer matches the strings of previously received characters at any of the stages of the shift register. At that time, the new code is output.

However, this architecture has the disadvantage that, when a match occurs, the encoding process has to stop for one clock cycle while a new search is started. This reduces the speed at which data can be processed by the device.

Jung and Burleson, in the paper "Efficient VLSI for Lempel-Ziv Compression in Wireless Data Communication Networks", IEEE Transactions on Very Large Scale Integration (VLSI) Systems, vol. 6, no. 3, September 1998 propose an alternative architecture. However, it is desirable to improve the speed of operation of a compression architecture.

BRIEF SUMMARY OF THE INVENTION

According to the present invention, there is provided a data compression architecture, including a shift register with multiple shift register elements. A data input receives input data characters, and applies each received input data character to the shift register, such that the received input data character is stored in each shift register element of said shift register in turn. Comparison circuitry is associated with each shift register element of the shift register, for comparing each received input data character with a respective input data character stored in said shift register element of the shift register. Logic circuitry is associated with each shift register element of the shift register, for detecting a match when the comparison circuitry determines that the received input data character is equal to the respective input data character stored in the shift register element of the shift register. A flush input receives a data flush input signal, and applies a received data flush input signal to the logic circuitry associated with each shift register element of the shift register, such that no match is detected by said logic circuitry when the data flush input signal is received.

According to the present invention, there is provided a data compression architecture, comprising a shift register, comprising multiple shift register elements. A data input receives input data characters, and applies each received input data character to the shift register, such that the received input data character is stored in each shift register element of the shift register in turn. Comparison circuitry is associated with each shift register element of the shift register, for comparing each received input data character with a respective input data character stored in the shift register element of the shift register. Logic circuitry is associated with each shift register element of the shift register, for detecting a match when the comparison circuitry determines that the received input data character is equal to the respective input data character stored in the shift register element of the shift register in two consecutive clock cycles, and for supplying a match output when the received input data character is equal to the respective input data character stored in the shift register element of the shift register in two consecutive clock cycles and when a match output criterion is met.

According to a further embodiment of the invention, there is provided a data compression architecture, comprising a shift register structure comprising first and second parallel paths, each of said paths comprising a respective plurality of shift register elements, for storing previously received data characters, each shift register element in the first parallel path being paired with a respective shift register element in the second parallel path; an input shift register, for receiving and storing input data characters in pairs during successive clock cycles, and for applying said stored pairs of input data characters to the register elements in said first and second parallel paths; logic circuitry, associated with each of said shift register element pairs, for comparing said received input data characters with each of the previously received data characters stored in the pairs of shift register elements, and for detecting a match between said received input data characters with said previously received data characters stored in the pairs of shift register elements during one or more clock cycles, and for determining a length of a sequence of received input data characters matching said stored previously received data characters by determining a number of clock cycles during which a match is detected in a particular pair of shift register elements, and applying a correction factor based on a type of match detected during a first clock cycle at a beginning of said sequence and during a later clock cycle at the end of said sequence.

According to another embodiment of the invention there is provided a data compression architecture, comprising a shift register structure comprising first and second parallel paths, each of said paths comprising a respective plurality of shift register elements, for storing previously received data characters, each shift register element in the first parallel path being paired with a respective shift register element in the second parallel path; an input shift register, for receiving and storing input data characters in pairs during successive clock cycles, and for applying said stored pairs of input data characters to the register elements in said first and second parallel paths; logic circuitry, associated with each of said shift register element pairs, for comparing said received input data characters with each of the previously received data characters stored in the pairs of shift register elements to detect a match between said received input data characters and said previously received data characters stored in the pairs of shift register elements during one or more clock cycles.

BRIEF DESCRIPTION OF THE DRAWINGS

FIGS. 5(a) to 5(d) illustrate the detection of match sequences in the shift register structure in accordance with the further embodiment of the invention.

FIGS. 6(a) to 6(d) illustrate the detection of the start of match sequences in the shift register structure in accordance with the further embodiment of the invention.

FIGS. 7(a) to 7(d) illustrate the detection of the end of match sequences in the shift register structure in accordance with the further embodiment of the invention.

DETAILED DESCRIPTION OF THE INVENTION

Figure 1:
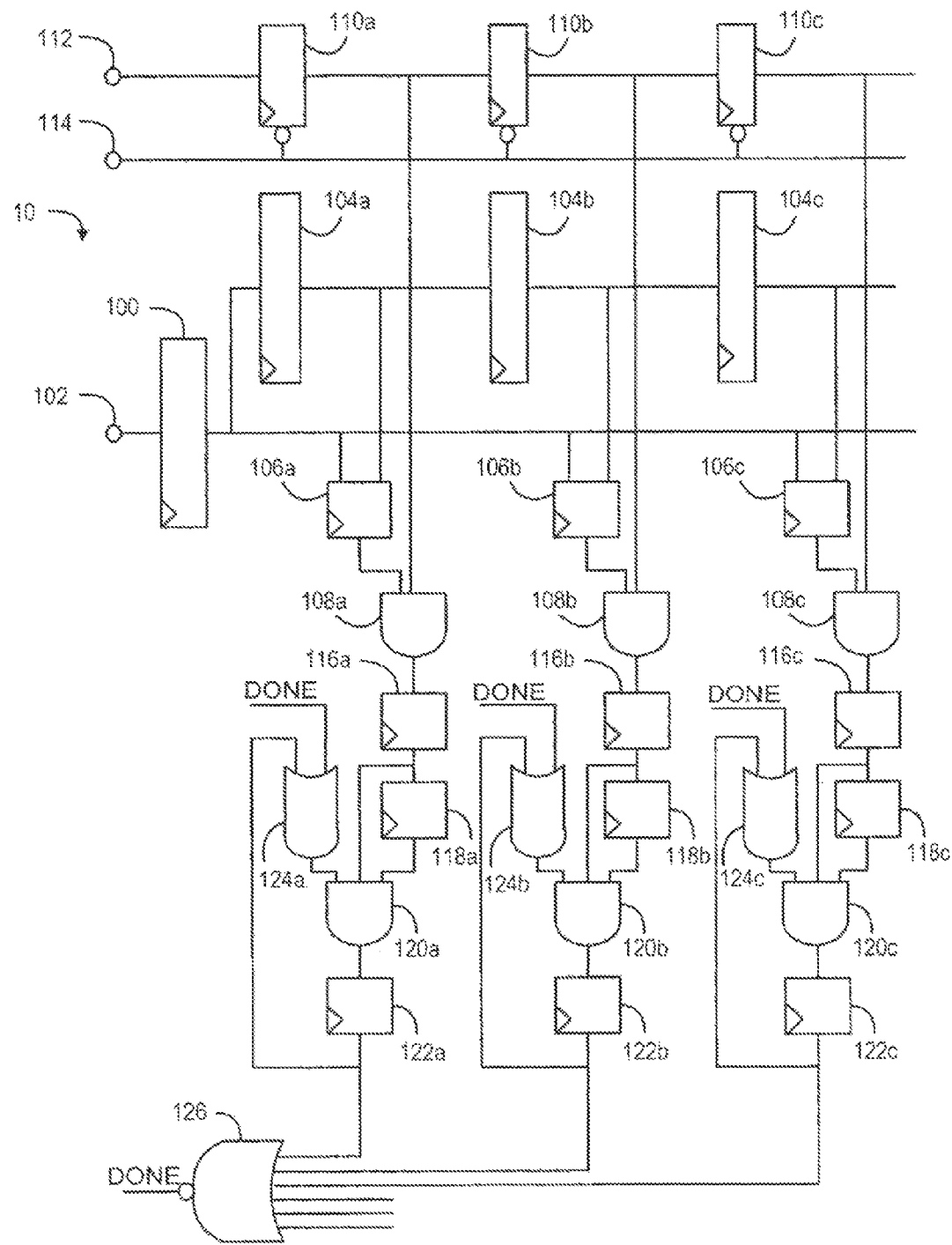
FIG. 1 is a block schematic diagram of a shift register structure, forming part of a compression architecture in accordance with the present invention.

FIG. 1 shows a shift register structure 10, forming part of a compression architecture, for achieving data compression, according to the Lempel-Ziv algorithm, which is well known to the person skilled in the art, and will not be described in detail herein, except in so far as is necessary for an understanding of the present invention.

In the preferred embodiment of the invention, the compression architecture is implemented in a field-programmable gate array (FPGA). However, it will be appreciated that the architecture can be implemented in any form of device, as required.

The Lempel-Ziv algorithm operates by detecting when a sequence of received characters matches a sequence that has been previously received. The algorithm proceeds on a character-by-character basis. That is, when a first character is received, it may be found that the same character has been received on many previous occasions. When a second character is received, it may then be found that the sequence of the first and second characters was received on some fraction of those previous occasions. Further characters are then received, until the longest previously received sequence, matching that newly received sequence, is found.

In order to detect the matching of the sequences, a shift register structure is used, as shown in FIG. 1. As will be apparent from the following description, FIG. 1 shows only three stages of the shift register, for ease of illustration and explanation. However, the shift register structure can contain any desired number of stages and, in a practical embodiment of the invention, the shift register structure can contain several hundreds or several thousands of stages. The data stored in the shift register structure in effect makes up a dictionary of received character strings.

A flip-flop 100 is connected to an input 102 of the circuit, and receives an input data word. Typically, the input data word is 8 bits long, and may for example represent a character in a text, although the algorithm can be used with data of many types.

During a following clock cycle, the input data word is clocked into the first stage of the shift register structure. In FIG. 1, and the following description, components of the first stage of the shift register structure are indicated by the suffix "a" appended to their reference numerals, components of the second stage of the shift register structure are indicated by the suffix "b" appended to their reference numerals, and components of the third stage of the shift register structure are indicated by the suffix "c" appended to their reference numerals. These stages all contain the same components, and operate in the same way.

Thus, in the clock cycle following its receipt, the input data word is clocked into the shift register element 104a of the first stage of the shift register structure. The shift register elements 104b, 104c are connected to the shift register element 104a, such that, during subsequent clock cycles, the input data word is clocked into the shift register element 104b, and then into the shift register element 104c, and so on.

The output of the shift register element 104a is also connected to a first input of a match block 106a. In the other stages of the shift register structure, the outputs of the shift register elements 104b, 104c etc are also connected to the respective first inputs of the match blocks 106b, 106c. The output of the flip-flop 100 is connected to a second input of the match block 106a, as well as to the second inputs of the other match blocks 106b, 106c.

The match block 106a outputs a logical "1" when the value stored in the flip-flop 100 matches the value stored in the shift register element 104a.

The output of the match block 106a is connected to a first input of a logical AND gate 108a, the operation of which will be described in more detail below.

The circuit also includes a flush shift register, containing a respective one-bit flush shift register element 110a, 110b, 110c, etc associated with each stage of the shift register structure. During operation of the circuit, it may be desirable to clear the dictionary of received character strings. For example, it is often the case that the most efficient compression of received data can be achieved by comparing the received data only with recently received data, rather than with data that was received less recently. More specifically, when the source of received data changes, it is usually desirable for the new data to be compressed without any reference to the previous set of data.

However, it is not desirable simply to clear the shift register elements 104a, 104b, 104c etc, because this would mean that a received string of 0's would appear to match the stored data.

An enable input 112 is connected to the input of the flush shift register element 110a, and is clocked on subsequent cycles to the inputs of the flush shift register elements 110b, 110c, etc. When the circuit is initialized, that is, when the first data word is input to the flip-flop 100 from the input 102, a logical "1" is input at the enable input 112, and this high level signal is loaded sequentially into each flush shift register element of the flush shift register on subsequent clock cycles.

A flush input 114 is connected, inverted, to the clear inputs of each of the flush shift register elements 110a, 110b, 110c, etc. When it is desired to clear the dictionary, for example when data is first received from a new dataset, a logical "1" is input at the flush input 114. All of the flush shift register elements 110a, 110b, 110c are then cleared within a single clock cycle.

Thus, the output of any one of the flush shift register elements 110a, 110b, 110c is high only when the logical "1", input at the enable input 112, has propagated sufficiently far along the flush shift register to reach that element, and only for so long as a logical "1" has not been input at the flush input 114.

The output of the flush shift register element 110a is connected to a second input of the logical AND gate 108a mentioned above. The outputs of the flush shift register elements 110b, 110c etc in the other stages are connected to the second inputs of the corresponding logical AND gates 108b, 108c etc.

Thus, provided that the output of the flush shift register element 110a is high, the logical AND gate 108a outputs a high signal, whenever the match block 106a outputs a high signal. Thus, this arrangement allows the dictionary to be flushed in a single clock cycle, or even during continuous data input.

The output of the logical AND gate 108a is connected to a register 116a. The output of the register 116a is connected to a further register 118a. Any signal input to the register 116a is thus applied to the further register 118a in the subsequent clock cycle.

The outputs of the register 116a and the further register 118a are applied to first and second inputs respectively of a three-input logical AND gate 120a. The output of the three-input logical AND gate 120a is then applied to a further register 122a. The output of the further register 122a is applied to the first input of an OR gate 124a.

The outputs of the further registers 122a, 122b, 122c etc in all of the stages of the circuit are then applied to respective inputs of a NOR gate 126.

The output of the NOR gate 126 forms a DONE signal, which is applied to the second inputs of the OR gates 124a, 124b, 124c etc in all of the stages of the circuit. Then the outputs of the OR gates 124a, 124b, 124c etc are applied to the respective third inputs of the three-input logical AND gate 120a.

In operation of the circuit, when the value stored in the flip-flop 100 matches the value stored in the shift register element 104a, the match block 106a outputs a logical "1".

Assuming that the output of the flush shift register element 110a is high, the logical AND gate 108a outputs a high signal, and this high signal is clocked into the register 116a. The high signal is then clocked into the register 118a during the next clock cycle.

The AND gate 120 therefore receives high signals on its first and second inputs when the register 116a produces a high output in two consecutive clock cycles. This occurs when a sequence of two consecutive values, received and stored in the flip-flop 100 during consecutive clock cycles, matches a sequence of two values stored in the shift register element 104a during those two clock cycles, given that the received data signals are being clocked through the shift register elements 104a, 104b, 104c . . . during consecutive clock cycles.

In that situation, then, if the signal on the third input of the AND gate 120a, from the output of the OR gate 124a, is also high, then the output of the AND gate 120a will be high, and the match register 122a will be set.

Thus, the match register 122a can be set only when a sequence of two or more of the received input data characters matches a sequence of the stored, previously received, data characters.

Since the output of the match register 122a is connected to one of the inputs of the OR gate 124a, then, if the match register 122a was previously set, it will remain set during the subsequent clock cycle, if the AND gate 120 is receiving high signals on its first and second inputs.

Moreover, the match register 122a will be set, provided that the AND gate 120 is receiving high signals on its first and second inputs, when the DONE signal is high.

When one or more of the match registers 122a, 122b, 122c etc in the different stages is set, the DONE signal on the output of the NOR gate 126 is low. The DONE signal on the output of the NOR gate 126 only becomes high when none of the match registers 122a, 122b, 122c etc in the different stages is set. This occurs when a received sequence of two or more of the received input data characters, matching a sequence of the stored input data characters, comes to an end.

Figure 2:
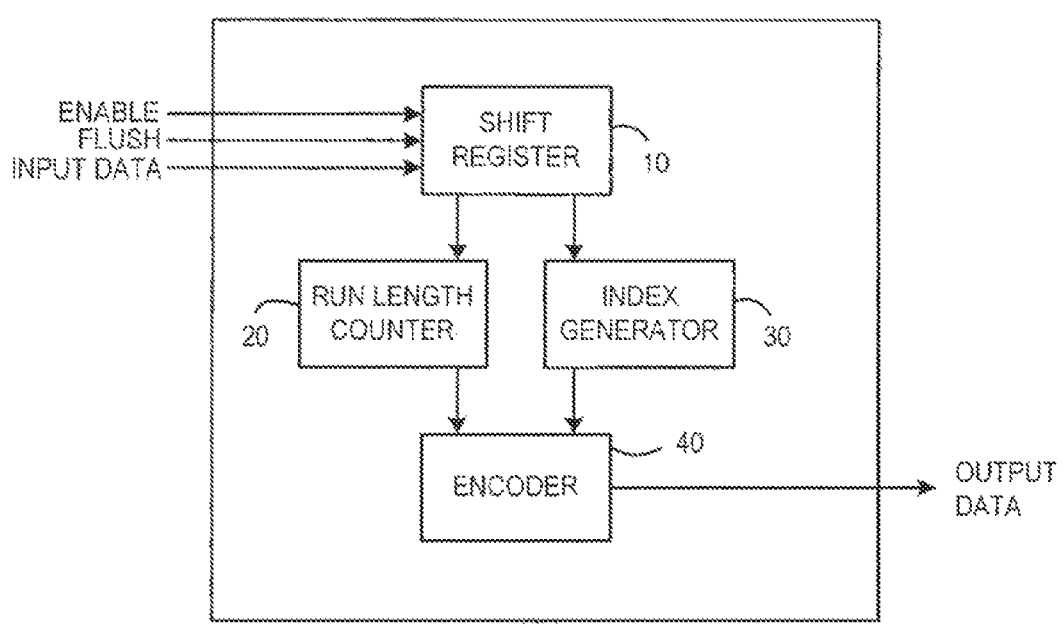
FIG. 2 is a block schematic diagram of a compression architecture in accordance with the present invention.

FIG. 2 is a block schematic diagram of a data compression architecture including the shift register structure 10. More specifically, the shift register structure 10 of the data compression architecture receives input data, which is supplied to the flip-flop 100 as described above, an enable signal, which is applied to the enable input 112, and a flush signal, which is applied to the flush input 114.

In order to produce an output code in the form <index, runlength>, the data compression architecture also includes a run length counter 20 and an index generator 30, each connected to the shift register structure 10. The outputs of the run length counter 20 and the index generator 30 are then supplied to an encoder 40, so that the encoder 40 can provide the output encoded data.

The run length counter 20 receives the DONE signal from the NOR gate 126, and is used to count the number of consecutive matches between the received data and the stored data. Since the combination of the registers 116a, 118a means that a match is detected by the AND gate 120 only when two consecutive characters match, the run length counter is initialized to the value 2, and increases the count by 1 for each clock cycle in which a DONE signal is not received. When a DONE signal is then received, the counter value indicates the run length.

The index generator 30 operates using a unary to binary converter, taking as its input the vector formed by the outputs of the registers 122a, 122b, 122c, etc. Typically, at the end of a run, only one of the registers 122a, 122b, 122c, etc will be active, and so the required index value can easily be obtained as the index of the active register 122. If two or more of the registers 122a, 122b, 122c, etc are active, a priority encoder (not shown) can be used to select the required index value as the index of the active register 122 having the lowest index value.

The encoder 40 can then combine the outputs of the run length counter 20 and the index generator 30 to produce the required output encoded data.

As mentioned above, this structure produces output data efficiently in the form <index, runlength>. That is, the structure is efficient in the sense that it can be initialized on the fly, without needing to be halted before the next match can be detected.

As an alternative, the shift register structure can be adapted such that the compression architecture produces output data efficiently in the form <index, runlength, last symbol>. In order to produce this form of output data efficiently, the shift register structure needs to detect when any single input character matches a stored character, rather than only detecting two or more consecutive matches.

In order to detect a single input character matching a stored character, only one of the registers 116, 118 need be provided, with that register being connected to receive the signal from the AND gate 108, and the output of that register then being applied to the AND gate 120.

When the compression architecture is to produce output data in the form <index, runlength, last symbol>, it needs to include a last symbol generator, for detecting the last symbol, which is to form part of the encoded data output. The last symbol in this case is the last input to the shift register.

In an embodiment of the invention, the second register 118 can be dynamically switchable into and out of the circuit. Thus, when it is desired to produce output data in the form <index, runlength, last symbol>, the second register 118 can be switched out of the circuit, while, when it is desired to produce output data in the form <index, runlength>, the second register 118 can be switched into the circuit.

When the DONE signal has gone high, and the end of a matching character string has been detected, the encoded data is output. Thereafter, in the immediately following clock cycle, any match register 122a, 122b, 122c etc can be set, provided that the AND gate 120 is receiving high signals on its first and second inputs.

The data can therefore be continuously processed, without requiring the circuit to be stopped when the end of a matching character string is reached.

The shift register structure described above allows unlimited pipelining to be inserted, for example between the input 102 and the register 116, as required to allow the architecture to operate at the required speed.

For example, there may be pipeline delays required to forward the last input to the output, when the structure produces data in the form <index, runlength, last symbol>. Similarly, pipeline delays may be required for the unary to binary circuit in the index generator 30, and specifically the internal priority circuit, to operate at speed. Further, the run length counter 20 may be offset in time from the rest of the circuit.

The output (code word) of the circuit can be independently calculated from the main part of the circuit, and can therefore be infinitely pipelined. If the runlength exceeds an arbitrary maximum (e.g. 32), a DONE signal can be forced. If the counter is offset in timeslots from the main part of the circuit, an offset can be applied to the count value to flag an end of run. For example, if the counter starts 2 cycles after the main circuit, and the maximum run length is 32, then the end of run will be flagged when the count value is 30.

As discussed above, the rate at which data can be compressed depends on the rate at which the characters can be switched through the shift register structure. In accordance with a further embodiment of the present invention, the rate is increased by using a parallel shift register structure. A parallel shift register structure allows two (or more) characters to be input each clock cycle, which means that the shift register structure can run at half the clock rate of the input.

Figure 3:
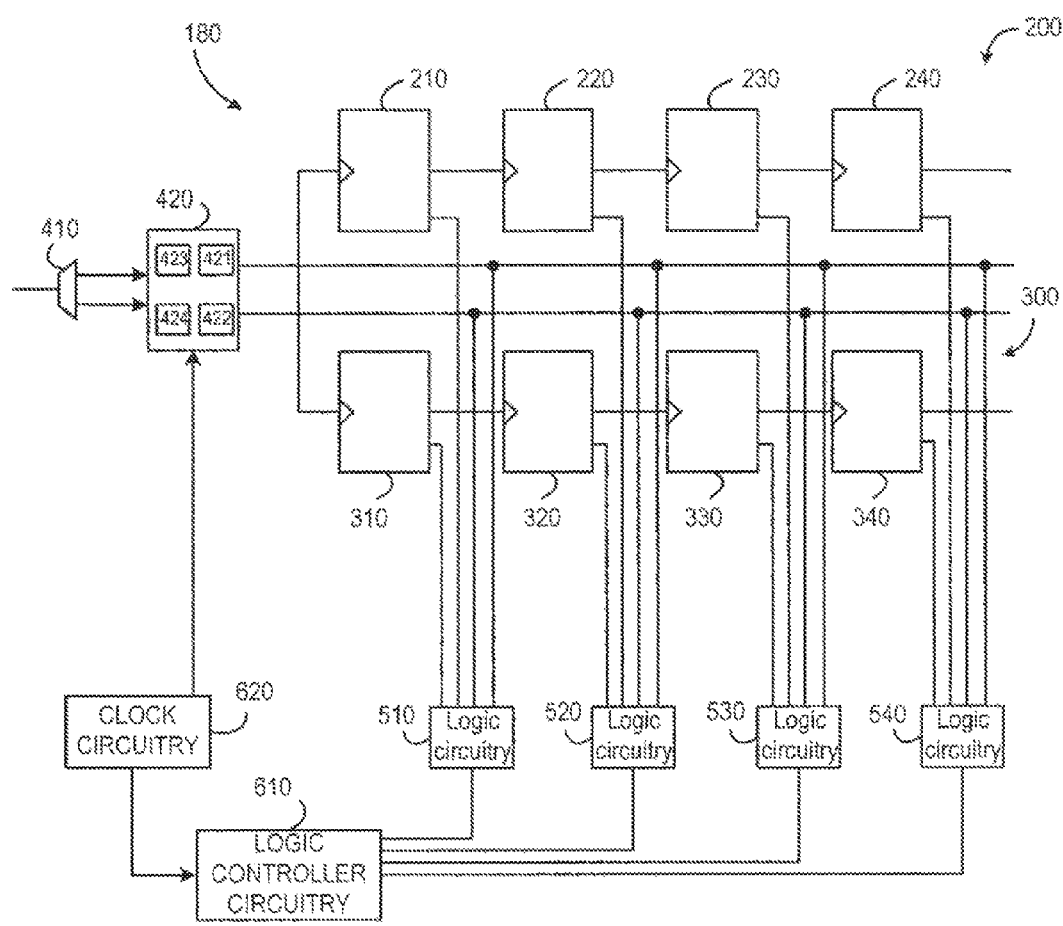
FIG. 3 is a block schematic diagram illustrating a shift register structure in the compression architecture in accordance with a further embodiment of the present invention.

FIG. 3 is a block schematic diagram illustrating an alternative shift register structure in a compression architecture in accordance with the further embodiment of the present invention. The parallel shift register structure 180 includes a first parallel path 200 and a second parallel path 300.

In this illustrative Figure, the first parallel path 200 contains shift register elements 210, 220, 230, 240, while the second parallel path 300 contains shift register elements 310, 320, 330, 340.

As will be apparent from the following description, FIG. 3 shows only four stages of the shift register, for ease of illustration and explanation. However, the shift register structure can contain any desired number of stages and, in a practical embodiment of the invention, the shift register structure can contain several hundreds or several thousands of stages. As above, the data stored in the shift register structure in effect makes up a dictionary of received character strings. Typically, each input data word is 8 bits long, and may for example represent a character in a text, although the algorithm can be used with data of many types.

As discussed above, in accordance with the Lempel-Ziv algorithm, it is necessary to detect sequences of received characters that match sequences of previously received and stored characters, and then to determine the lengths of such sequences.

An input data stream is passed into demultiplexer 410, which alternately provides characters to the first and second parallel paths 200, 300. The newly received characters are applied to input shift register 420, which comprises four input shift register elements 421, 422, 423, 424, with elements 421 and 423 being associated with the first parallel path 200 and elements 422 and 424 being associated with the second parallel path 300.

Two new characters are received each clock cycle in the shift register structure 180 and are initially stored in elements 423 and 424 of the input shift register 420. The characters previously stored in elements 423 and 424 are shifted into input shift register elements 421 and 422 respectively. The characters previously stored in elements 421 and 422 are shifted into the first shift register elements 210 and 310 of the first and second parallel paths 200, 300 respectively. The characters previously stored in the shift register elements of the first and second parallel paths 200, 300 are each shifted one stage further down the path. When characters are described as being shifted along the shift register structure, the characters are shifted along their respective parallel path. Thus, during the operation of the parallel shift register structure 180, the elements of the input shift register 420 contain the four characters received during the last two clock cycles.

If it is desired to use a dictionary of 512 previously received characters, each of the parallel paths 200, 300 will contain 256 shift registers.

As the dictionary of previously received character strings is being built up, three of the newly received characters stored in the input shift register 420 are compared with the characters stored in the shift registers in the parallel shift register structure 180. Specifically, this comparison takes the form of a matrix comparison, with the newly received characters stored in input shift register elements 421 and 422 and the newly received characters stored in input shift register elements 422 and 423 being compared with the two history characters stored in the shift register elements 210, 310 in associated logic circuitry 510 in turn; at the same time, they are compared with the two history characters stored in the shift register elements 220, 320 in associated logic circuitry 520; they are compared with the two history characters stored in the shift register elements 230, 330 in associated logic circuitry 530; and they are compared with the two history characters stored in the shift register elements 240, 340 in associated logic circuitry 540, and so on.

By noting the individual results of the pair comparisons, it is also possible for the two pairs of newly received characters (421 and 422; 422 and 423) to be compared with consecutive characters stored in adjacent stages of the shift register structure 180. For example, the character stored in input shift register element 421 can be compared with the history character stored in shift register element 330 and the next character stored in input shift register element 422 can be compared with the history character stored in shift register element 220.

In this illustrated embodiment, the character in input shift register element 424 is not used in the comparison stage. However, that character will be used in the comparisons carried out in the next clock cycle as the characters in elements 423 and 424 will have been shifted forwards to input shift register elements 421 and 422 respectively.

The reasoning behind these particular comparisons will be explained further below.

Logic circuit blocks 510, 520, 530, 540 produce respective outputs, indicating which of the comparisons, between the first three of the four characters in the input shift register 420 on the one hand and the pairs of stored history characters on the other hand, has produced a match.

The outputs from the logic circuit blocks 510, 520, 530, 540 are then supplied to logic controller circuitry 610, where they are stored and processed, as described in more detail below.

In an embodiment of the invention, the logic circuit blocks 510, 520, 530, 540 and the logic controller circuitry 610 substantially correspond to match block 106, logical AND gate 108, register 116, register 118, three-input logical AND gate 120, register 122 and OR gate 124 of the architecture shown in FIG. 1. However, it will be appreciated by a person skilled in the art that the logic circuit blocks 510, 520, 530, 540 can use alternative configurations to perform the comparison functions.

The circuit operates at a particular operating clock rate, generated by clock circuitry 620, and, in each clock cycle, as the outputs from the logic circuit blocks 510, 520, 530, 540 are being processed in the logic controller circuitry 610, the clock circuitry is clocking two further newly received data characters into the input shift registers 423, 424.

As discussed above, a primary function of the logic controller circuitry 610 is to detect sequences of newly received data characters that match sequences of data characters stored in the shift register elements of the parallel paths 200, 300. Of particular importance is that, for each sequence of newly received data characters starting from a particular identified one of those characters, the logic controller circuitry 610 should be able to detect the longest previously stored sequence that matches the sequence of newly received characters.

The length of any sequence of newly received data characters matching a sequence of history characters can be detected to a first approximation by examining the number of clock cycles during which a particular logic circuitry block 510-540 detects matches. That is, during a matching sequence, where the sequence of newly received characters matches a part of the history sequence, we can consider a series of clock cycles. In one clock cycle, one of the logic circuitry blocks 510-540 will detect matches between two consecutive characters of the newly received characters and the two characters stored in the associated shift registers at that time. During the next clock cycle, when the characters in the history sequence have shifted through the shift register structure 10, that same one of the logic circuitry blocks 510-540 will detect matches between the next two newly received characters and the two subsequent characters stored in the associated shift registers at that time.

Thus, to a first approximation, the length of the matching sequence is twice the number of clock cycles during which these matches are detected. However, a correction factor is required which takes into account whether one or both newly received characters match the characters stored in the appropriate shift registers. In other words, the correction factor is based on the number of matches detected during the first clock cycle at the start of the matched sequence, and during a clock cycle at the end of the matched sequence. This is explained further below.

Therefore, as the sequence of matched characters may start with the character stored in the register element in the second parallel path 300 (which means that the character in the corresponding register element in the first parallel path 200 does not match the previously received character), and/or end with the character stored in the register element in the first parallel path 200 (which means that the character in the corresponding register element in the second parallel path 300 does not match the next received character), it is necessary for the logic circuitry to identify the manner in which the matched sequence starts and ends. From this information, the position (i.e. appropriate register element) in the dictionary at which the matched sequence starts can be determined, along with the run length of the sequence.

Figure 4:
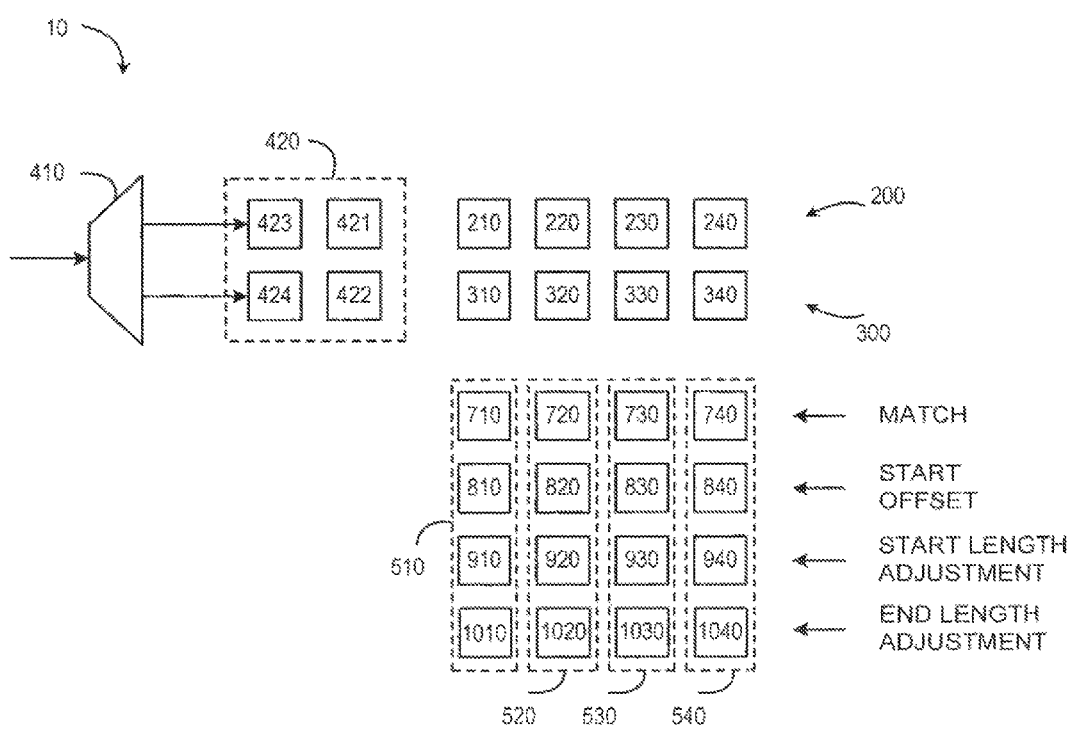
FIG. 4 is a simplified block schematic diagram illustrating a shift register structure and logic circuitry in accordance with the further embodiment of the invention.

FIG. 4 shows a simplified block diagram of the shift register structure 180 from FIG. 3 in accordance with this embodiment of the invention, with exemplary logic elements required to correctly identify the complete matched sequence of characters, and the position in the parallel shift register structure in which the sequence starts.

As above, the shift register structure 180 comprises a demultiplexer 410 connected to input shift register 420 and respective first and second parallel paths 200, 300. Each of the logic circuitry blocks 510, 520, 530, 540 associated with a respective pair of shift register elements comprises a respective match register 710, 720, 730, 740, start offset register 810, 820, 830, 840, start length adjustment register 910, 920, 930, 940 and end length adjustment register 1010, 1020, 1030, 1040.

The run length of the sequence is equal to twice the number of clock cycles in which a particular match register 710, 720, 730, 740 is valid (since there is one match register for two shift register elements), added to the values stored in the associated start length adjustment register 910, 920, 930, 940 and end length adjustment register 1010, 1020, 1030, 1040. Thus, the correction factor outlined above is given by the sum of the values stored in the appropriate start and end length adjustment registers.

In this illustrated embodiment of the invention, the match registers store respective single bits (indicating no match or a match), the start offset registers store respective pairs of bits (indicating offset values of −1, 0 or +1), the start length adjustment registers store respective single bits (indicating length adjustment values of −1 or 0), and the end length adjustment registers store respective pairs of bits (indicating length adjustment values of −1, 0 +1).

Figure 5A:
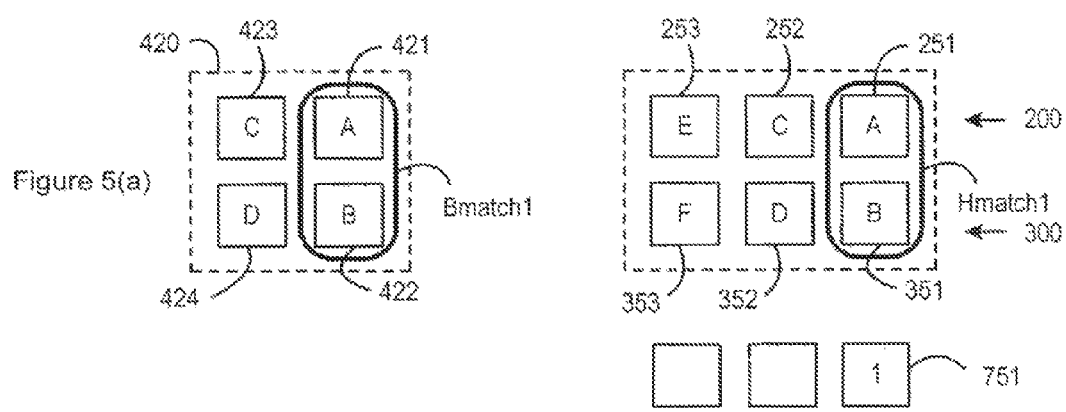
Figure 5B:
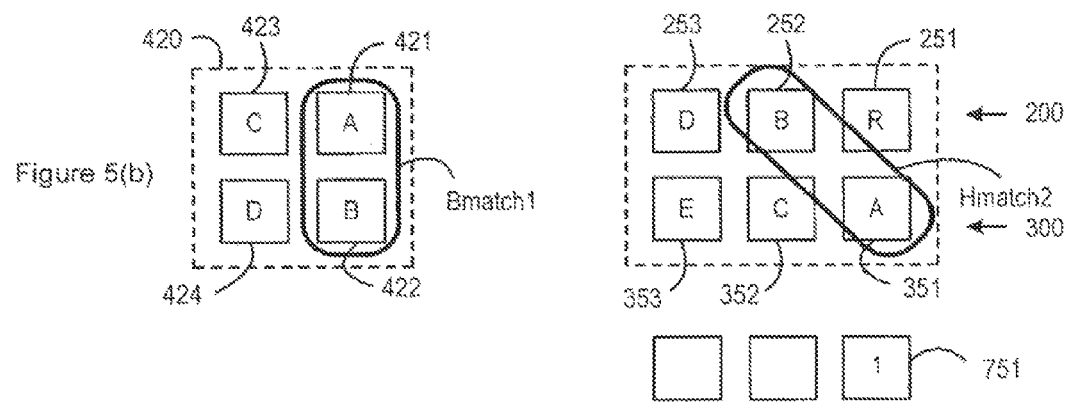

FIGS. 5(a), 5(b), 5(c) and 5(d) show the situations in which a match register is set. Both FIGS. 5(a) and 5(b) show the input shift register 420 with the four most recently received characters being stored in input shift register elements 421, 422, 423 and 424 respectively. Each of the Figures also show three consecutive pairs of shift register elements from the first and second parallel paths 200, 300. These consecutive pairs of shift register elements may be located anywhere along the parallel paths in the shift register structure 180. The illustrated shift register elements in the first parallel path are denoted 251, 252, 253 and the elements in the second parallel path 300 are denoted 351, 352, 353. Previously received characters are stored consecutively in the elements of the shift register structure 180, i.e. the characters are stored in elements 251, 351, 252, 352, 253, 353, etc.

In each of the illustrations in FIG. 5, a newly received sequence of characters starting A, B, C, is to be matched to the same sequence of characters stored in the shift register structure 180. In FIGS. 5(a) and (b), the input shift register 420 has the sequence of characters A, B, C and D stored in input shift register elements 421, 422, 423, 424 respectively.

The first match situation is shown in FIG. 5(a), where it can be seen that characters A and B in input shift register elements 421 and 422 are matched by the characters in shift register elements 251 and 351 respectively. This situation is denoted Bmatch1&Hmatch1 and results in match register 751 associated with shift register elements 251 and 351 being set to 1, indicating a match.

The second match situation is shown in FIG. 5(b), where it can be seen that characters A and B in input shift register elements 421 and 422 are matched by the characters in shift register elements 351 and 252 respectively. This situation is denoted Bmatch1&Hmatch2 and results in the match register 751 associated with shift register elements 251 and 351 being set to 1, indicating a match.

FIGS. 5(c) and (d), the input shift register 420 has the sequence of characters S, A, B and C stored in input shift register elements 421, 422, 423, 424 respectively.

The third match situation is shown in FIG. 5(c), where it can be seen that characters A and B in input shift register elements 422 and 423 are matched by the characters in shift register elements 251 and 351 respectively. This situation is denoted Bmatch2&Hmatch1 and results in match register 751 associated with shift register elements 251 and 351 being set to 1, indicating a match.

The fourth match situation is shown in FIG. 5(d), where it can be seen that characters A and B in input shift register elements 422 and 423 are matched by the characters in shift register elements 351 and 252 respectively. This situation is denoted Bmatch2&Hmach2 and results in the match register 751 associated with shift register elements 251 and 351 being set to 1, indicating a match.

In all other cases, match register 751 will be set or reset to value 0, indicating no match.

As parallel paths are used to store previously received characters, there are four possible match situations in which a match sequence can start. These four start match situations are illustrated in FIG. 6.

Figure 6A:
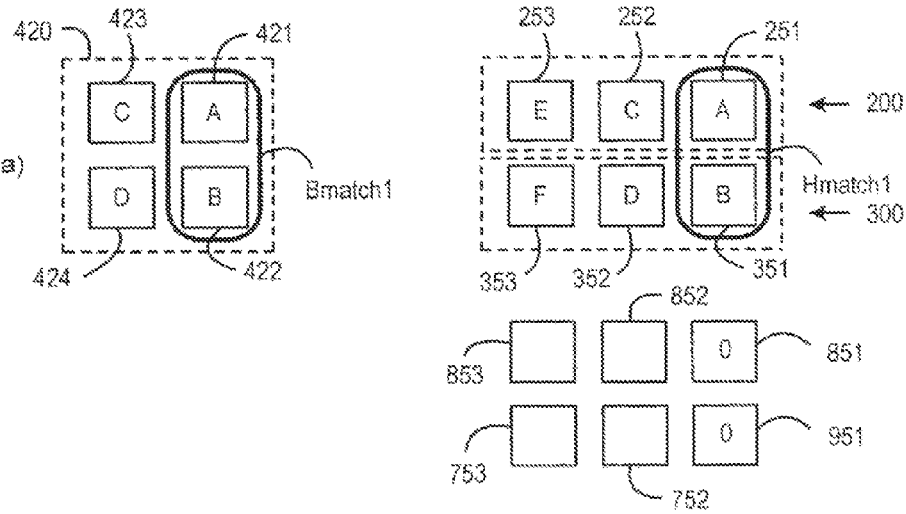

Each of FIGS. 6(a), (b), (c) and (d) show a shift register structure 180 as set out in FIG. 5. In addition, start offset registers, 851, 852, 853 and start length adjustment registers 951, 952, 953 are shown that are associated with the respective pairs of shift register elements 251, 351; 252, 352; 253, 353.

In each of the illustrations in FIG. 6, a newly received sequence of characters starting A, B, C, is to be matched to the same sequence of characters stored in the shift register structure 180.

In FIGS. 6(a) and (b), the input shift register 420 has the sequence of characters A, B, C and D stored in input shift register elements 421, 422, 423, 424 respectively.

The first start match situation is shown in FIG. 6(a), where it can be seen that characters A and B in input shift register elements 421 and 422 are matched by the characters in shift register elements 251 and 351 respectively. This situation is denoted Bmatch1&Hmatch1 and as the newly-received sequence and the matched sequence both start in a register element of the first parallel path 200, the start offset register 851 associated with shift register elements 251 and 351 is set to 0. For the same reason, the start length adjustment register 951 associated with shift register elements 251 and 351 is set to 0.

Figure 6B:
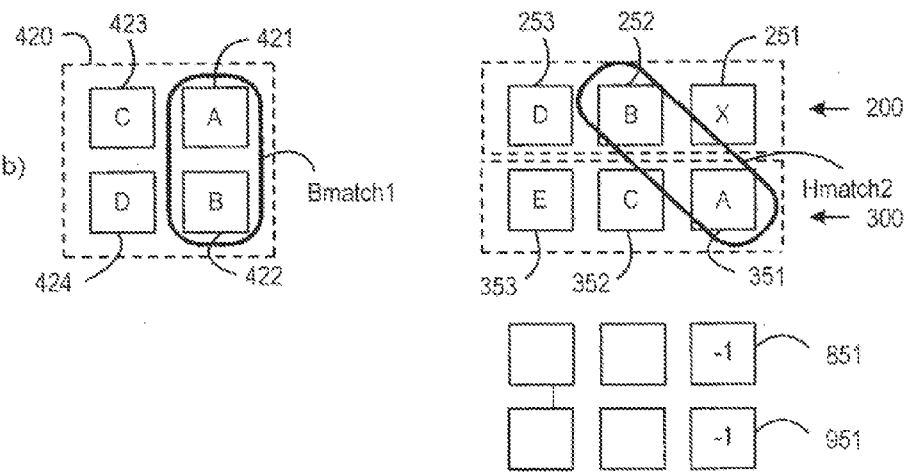

The second start match situation is shown in FIG. 6(b), where it can be seen that characters A and B in input shift register elements 421 and 422 are matched by the characters in shift register elements 351 and 252. This situation is denoted Bmatch1&Hmatch2, and, provided that the situation in FIG. 6(c) below does not apply, the start offset register 851 associated with shift register elements 251 and 351 is set to −1 as the newly-received sequence starts in a register element of the first parallel path 200 and the matched sequence starts in an 'earlier' register element of the second parallel path 300.

In addition, it can be seen that this situation corresponds to that shown in FIG. 5(b), and therefore, the match register associated with shift register elements 251 and 351 will also be set to 1. Thus, it can be seen that when the length of the matched sequence is calculated, it is necessary to reduce the length by one as the character in shift register element 251 is not part of the matched sequence. Therefore the start length adjustment register 951 is set to −1.

In FIGS. 6(c) and (d), the input shift register 420 has the sequence of characters Y, A, B and C stored in input shift register elements 421, 422, 423, 424 respectively. Thus, in these two situations, the sequence of characters to be matched starts in element 422, rather than element 421 as in FIGS. 6(a) and (b).

The third start match situation is shown in FIG. 6(c), where it can be seen that characters A and B in input shift register elements 422 and 423 are matched by the characters in shift register elements 251 and 351 respectively. This situation is denoted Bmatch2&Hmatch1, and, provided that the situation in FIG. 6(a) does not apply, the start offset register 851 associated with shift register elements 251 and 351 is set to +1 as the newly-received sequence starts in a register element of the second parallel path 300 and the matched sequence starts in a 'later' register element of the first parallel path 200. For the same reason, the start length adjustment register 951 is set to −1.

The fourth start match situation is shown in FIG. 6(d), where it can be seen that characters A and B in input shift register elements 422 and 423 are matched by the characters in shift register elements 351 and 252. This situation is denoted Bmatch2&Hmatch2 and results in the start offset register 851 associated with shift register elements 251 and 351 being set to 0 as both the newly-received and matched sequence start in a register element of the second parallel path 300. In this situation, character Y in input shift register element 421 is not matched by the character stored in shift register element 251, character Z (in other words, for this situation to apply, Bmatch1 must not match Hmatch1). The start length adjustment register 951 is set to −1.

The required start offset value and start length adjustment value are latched the first time the associated match register is set to 1, and are maintained until the match register is reset to 0 at the end of a matched sequence.

As indicated above, when a matched sequence of characters ends, for example when a DONE signal is generated, it is necessary to determine how the sequence of characters has ended. As with the start match of the sequence, there are four possible ways in which a matched sequence can end. These four situations are illustrated in FIG. 7. However, unlike with the start match of a sequence, it is necessary to consider the status of the shift register stages in the clock cycle immediately preceding the clock cycle in which the mismatch was identified.

Thus, each of FIGS. 7(a), (b), (c) and (d) show a shift register structure 180 as set out in FIG. 5 in the clock cycle immediately before the clock cycle in which a character mismatch has been detected. End length adjustment registers 1051, 1052, 1053 are shown that are associated with respective pairs of shift register elements 251, 351; 252, 352; and 253, 353.

In each of the illustrations in FIG. 7, the sequence of characters ending with character F has been matched to the characters stored in the shift register structure 180. The character newly received after character F, denoted character G, has been determined (in the clock cycle following those illustrated) to not match the next character stored in the shift register 180, denoted character P.

In FIGS. 7(a) and (b), the input shift register 420 has the sequence of characters E, F, G and H stored in input shift register elements 421, 422, 423, 424 respectively.

The first end match situation is shown in FIG. 7(a), where it can be seen that characters E and F in input shift register elements 421 and 422 are matched by the characters in shift register elements 252 and 352 respectively. The next character in shift register element 253, character P, does not match the next newly received character, character G, in input shift register element 423. This situation is denoted Bmatch1&Hmatch1 and results in end length adjustment register 1052 associated with shift register elements 252 and 352 being set to 0.

The second end match situation is shown in FIG. 7(b), where it can be seen that characters E and F in input shift register elements 421 and 422 are matched by the characters in shift register elements 351 and 252. The next character in shift register element 352, character P, does not match the next newly received character, character G, in input shift register element 423. This situation is denoted Bmatch1&Hmatch2 and results in the end length adjustment register 1051 associated with shift register elements 251 and 351 being set to +1.

In FIGS. 7(c) and (d), the input shift register 420 has the sequence of characters D, E, F and G stored in input shift register elements 421, 422, 423, 424 respectively.

The third end match situation is shown in FIG. 7(c), where it can be seen that characters E and F in input shift register elements 422 and 423 are matched by the characters in shift register elements 252 and 352 respectively. The next character in shift register element 253, character P, does not match the next newly received character, character G, in input shift register element 424. This situation is denoted Bmatch2&Hmatch1 and results in the end length adjustment register 1052 associated with shift register elements 252 and 352 being set to −1.

The fourth end match situation is shown in FIG. 7(d), where it can be seen that characters E and F in input shift register elements 422 and 423 are matched by the characters in shift register elements 351 and 252. The next character in shift register element 332, character P, does not match the next newly received character, character G, in input shift register element 424. This situation is denoted Bmatch2&Hmatch2 and results in the end length adjustment register 1051 associated with shift register elements 251 and 351 being set to 0.

It should be noted that in some cases there may be an ambiguous case when determining the end length adjustment value. This situation only occurs if there are at least two consecutive identical symbols in the input shift register 410 and three consecutive identical symbols in the shift register elements of the first and second parallel paths 200 and 300. There is no ambiguity in the situations where there is a match offset between the two registers, i.e. such as depicted in FIGS. 7(a) and 7(d). In the situations shown in FIGS. 7(b) and 7(c), the exact end point cannot be determined, so an alternate method must be used. In these cases, the last match that can be guaranteed is considered to be the last unambiguous match i.e. that which occurred during the previous clock cycle. The length is therefore reduced by 2 (i.e. end length adjustment is −2), and the start offset and start length adjustment values applied. The ambiguous symbols are therefore coded separately from the generated codeword. This will reduce the coding efficiency slightly, but as these cases are most likely rare, in practice there should be only a very slight degradation in coding efficiency. Thus there will be some cases of three consecutive identical symbols that will not be coded together, but will be considered as individual symbols.

Once a matched sequence has been identified, the start address of the sequence is the address of the match register 710, 720, 730, 740 which has indicated a matching sequence plus the value stored in the respective start offset register 810, 820, 830, 840.

The length of the sequence is given by doubling the number of clock cycles that a match register has indicated a match, added to the values stored in the associated start and end length adjustment registers.

It will be appreciated by a person skilled in the art that much of the functionality of the shift register structure according to the further embodiment of the invention can be implemented as shown in the shift register structure of FIG. 1, such as the setting and clearing of the match register, incrementing and clearing the counter, determining the history index and providing the flush shift register elements.

In the illustrated embodiment of the invention, the architecture is able to operate at high speed because there are two parallel shift register structures and, in each clock cycle, two new characters are input, and are compared with the previously received characters in a series of matrix comparisons, although this makes the required logic to detect the sequence length slightly more complex. It will be apparent that, in other embodiments of the invention, there may be a larger number of parallel shift register structures and the same larger number of new characters clocked in to the circuit in each clock cycle. For example, with three parallel shift register structures, three new characters may be input in each clock cycle, and compared with the previously received characters in a series of 3×3 matrix comparisons, at a cost of a further increase in the required complexity of the required logic to detect the sequence length.

There is therefore described a circuit which allows high speed processing of received data in accordance with the Lempel-Ziv algorithm.

What is claimed is:

1. A data compression architecture, comprising:
   means for receiving input data characters;
   means for receiving a data flush enable input signal, wherein said data flush input signal is asserted in response to said means for receiving input data characters beginning to receive said input data characters from a new source;
   means for storing a plurality of previously received data characters, wherein the plurality of previously received data characters are cleared within a clock cycle in response to the data flush enable input signal;
   means for comparing each received input data character with said plurality of stored data characters;
   means for detecting a match in response to determining that a sequence of two or more of the received input data characters is equal to a sequence of the stored data characters;
   means for determining that a match criterion is met; and
   means for supplying a match output in response to said detecting a match and in response to said determining that a match criterion is met.

2. The data compression architecture of claim 1, wherein said match criterion is met in response to a previous match output being supplied in an immediately preceding clock cycle from said means for supplying a match output.

3. The data compression architecture of claim 1, wherein:
   the received input data characters are stored in pairs of input data characters during successive clock cycles and said stored pairs of input data characters are applied to first and second parallel paths, wherein each of said paths stores said previously received data characters; and
   at least one of the received input data characters is compared to each of the previously received data characters stored during one ore more clock cycles.

4. A data compression architecture comprising:
   a data input, for receiving input data characters;
   a first memory structure for storing a plurality of previously received data characters;
   a second memory structure for receiving a data flush input signal and for applying the received data flush input signal to said logic circuitry in response to the data input beginning to receive said input data characters from a new source,
   wherein the plurality of previously received data characters are cleared within a clock cycle in response to the data flush enable input signal;
   comparison circuitry for comparing each of the received input data characters with said plurality of stored data characters; and
   logic circuitry for detecting a match in response to determining that a sequence of two or more of the received input data characters is equal to a sequence of the stored data characters, for determining that a match criterion is met, and for supplying a match output in response to said detecting a match and in response to said determining that a match criterion is met.

5. The data compression architecture of claim 4, wherein said match criterion is met either when a previous match output was supplied from said logic circuitry in an immediately preceding clock cycle, or when no match output was output from said logic circuitry.

6. The data compression architecture of claim 4, wherein said logic circuitry is dynamically switchable based on a desired output form.

7. The data compression architecture of claim 6, wherein, in a first mode, the logic circuitry detects a match when said comparison circuitry determines that one of the received input data characters is equal to a respective data character stored in a register element of said memory structure in two or more consecutive clock cycles, and, in a second mode, the logic circuitry detects a match when said comparison circuitry determines that the one of the received input data characters is equal to the respective data character stored in said register element of said memory structure in one or more consecutive clock cycles.

8. The data compression architecture of claim 4, wherein the received input data characters are stored in pairs of input data characters during successive clock cycles and said stored pairs of input data characters are applied to first and second parallel paths, wherein each of said paths stores said previously received data characters; and
   at least one of the received input data characters is compared to each of the previously received data characters stored during one ore more clock cycles.

9. The data compression architecture of claim 4, wherein said memory structure comprises first and second parallel paths, each of said paths comprising a respective plurality of register elements for storing said previously received data characters, and each register element in the first parallel path being paired with a respective register element in the second parallel path.

10. The data compression architecture of claim 9, wherein:
    said memory structure stores the received input data characters in pairs during successive clock cycles, and applies said stored pairs of input data characters to pairs of register elements in said first and second parallel paths; and
    said logic circuitry is associated with each of said pairs of register elements, and compares said received input data characters with each of the previously received data characters stored in said pairs of register elements to detect a match between said received input data characters and said previously received data characters stored in the pairs of register elements during one or more clock cycles.

11. A method of operating a data compression architecture, the method comprising:
    receiving input data characters;
    storing a plurality of previously received data characters in a memory structure;
    asserting a data flush input signal when said input data characters are first received from a new dataset, wherein the plurality of previously received data characters are cleared within a clock cycle in response to the data flush enable input signal;
    comparing, using comparison circuitry, each received input data character of the received input data characters with said plurality of stored data characters;
    detecting a match, using logic circuitry, in response determining that a sequence of two or more of the received input data characters is equal to a sequence of the stored data characters;
    determining that a match criterion is met; and
    supplying, using the logic circuitry, a match output in response to said detecting a match and in response to said determining that a match criterion is met.

12. The method of operating a data compression architecture of claim 11, wherein said match criterion is met either when a previous match output was output from said logic circuitry in an immediately preceding clock cycle, or when no match output was output from said logic circuitry.

13. The method of operating a data compression architecture of claim 11, further comprising dynamically switching said logic circuitry based on a desired output form.

14. The method of operating a data compression architecture of claim 13, wherein, in a first mode, the logic circuitry detects a match when said comparison circuitry determines that one of the received input data characters is equal to a respective data character stored in a register element of said memory structure in two or more consecutive clock cycles, and, in a second mode, the logic circuitry detects a match when said comparison circuitry determines that the one of the received input data characters is equal to the respective data character stored in said register element of said memory structure in one or more consecutive clock cycles.

15. The method of operating a data compression architecture of claim 11, wherein:
- the memory structure comprises first and second parallel paths;
- each of said paths comprises a respective plurality of register elements for storing the previously received data characters; and
- each register element in the first parallel path is paired with a respective register element in the second parallel path.

16. The method of operating a data compression architecture of claim 15, further comprising:
- storing the received input data characters in pairs during successive clock cycles;
- applying said stored pairs of input data characters to pairs of register elements in said first and second parallel paths; and
- comparing said received input data characters with each of the previously received data characters stored in said pairs of register elements to detect a match between said received input data characters and said previously received data characters stored in the pairs of register elements during one or more clock cycles.

17. The method of operating a data compression architecture of claim 15, wherein the received input data characters are processed in accordance with a Lempel-Ziv algorithm.

* * * * *